US012690367B2

(12) United States Patent

Ishida

(10) Patent No.: US 12,690,367 B2
(45) Date of Patent: Jul. 21, 2026

(54) DISPLAY DEVICE, INCLUDING A SEALING LAYER WITH DIFFERENT THICKNESSES AND MANUFACTURING METHOD THEREOF

(71) Applicant: Magnolia White Corporation, Tokyo (JP)

(72) Inventor: Arichika Ishida, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 492 days.

(21) Appl. No.: 18/297,663

(22) Filed: Apr. 10, 2023

(65) Prior Publication Data

US 2023/0345796 A1 Oct. 26, 2023

(30) Foreign Application Priority Data

Apr. 21, 2022 (JP) ................................. 2022-070106

(51) Int. Cl.
| | |
|---|---|
| *H10K 59/80* | (2023.01) |
| *H10K 59/122* | (2023.01) |
| *H10K 71/00* | (2023.01) |
| *H10K 102/00* | (2023.01) |

(52) U.S. Cl.
CPC ......... *H10K 59/871* (2023.02); *H10K 59/873* (2023.02); *H10K 71/00* (2023.02); *H10K 59/122* (2023.02); *H10K 2102/351* (2023.02)

(58) Field of Classification Search
CPC .. H10K 59/871; H10K 59/873; H10K 59/122; H10K 2102/351; H10K 59/10
See application file for complete search history.

(56) References Cited

U.S. PATENT DOCUMENTS

| | | |
|---|---|---|
| 2004/0160170 A1 | 8/2004 | Sato et al. |
| 2009/0009069 A1 | 1/2009 | Takata |
| 2015/0014636 A1 | 1/2015 | Kang |
| 2017/0194398 A1* | 7/2017 | Kim ..................... H10K 59/352 |
| 2019/0363275 A1 | 11/2019 | Ochi et al. |

(Continued)

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |

(Continued)

OTHER PUBLICATIONS

Office Action issued Mar. 17, 2026, in JP Application No. 2022-070106, 6pp.

*Primary Examiner* — Davienne N Monbleau
*Assistant Examiner* — Heim Kirin Grewal
(74) *Attorney, Agent, or Firm* — XSENSUS LLP

(57) ABSTRACT

According to one embodiment, a display device includes a lower electrode, a rib including a pixel aperture, a partition on the rib, an upper electrode contacting the partition, an organic layer between the lower and upper electrodes, and a sealing layer covering a display element and the partition, the display element including the lower electrode, the upper electrode and the organic layer. The sealing layer includes a first portion which is located above the rib and has a first thickness, and a second portion which is located above the lower electrode exposed from the rib through the pixel aperture and has a second thickness less than the first thickness.

18 Claims, 13 Drawing Sheets

(56) References Cited

U.S. PATENT DOCUMENTS

2022/0077251 A1    3/2022  Choung et al.
2022/0085327 A1*   3/2022  Kim ................... H10K 59/8722

FOREIGN PATENT DOCUMENTS

JP          2009-32673  A      2/2009
JP          2010-118191 A      5/2010
JP          2010-256538 A     11/2010
JP          2010-257694 A     11/2010
WO          2018/179308 A1    10/2018

* cited by examiner

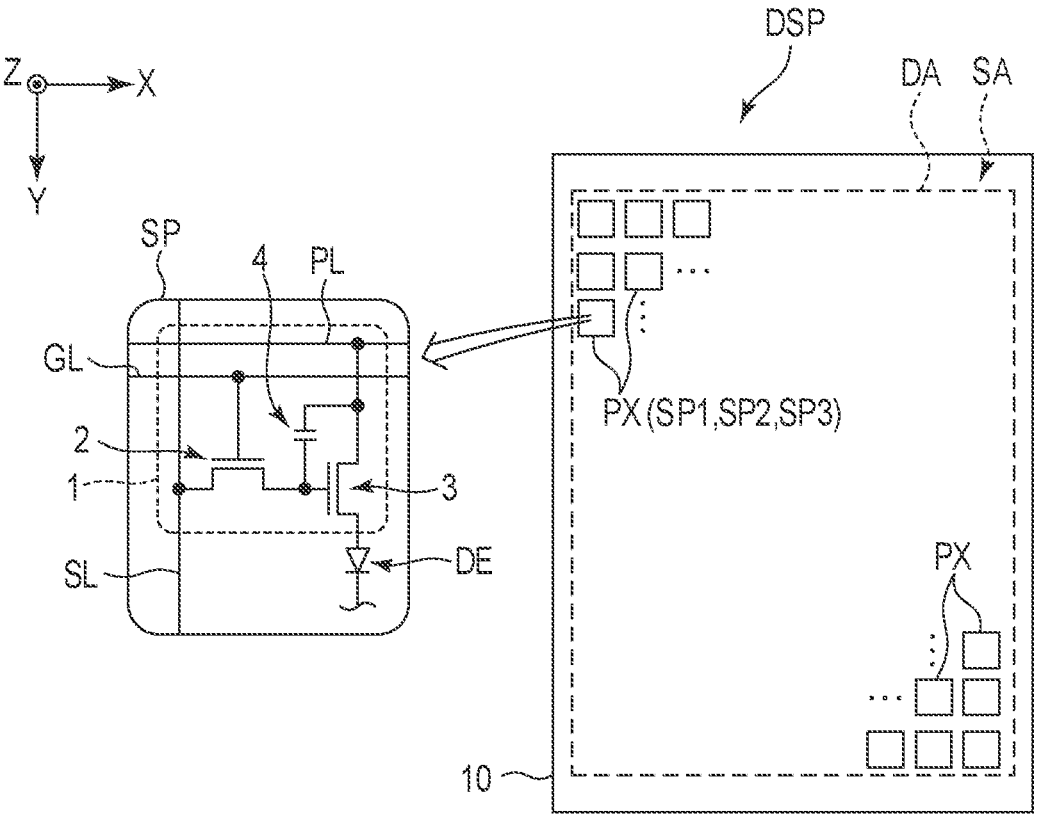
F I G. 1

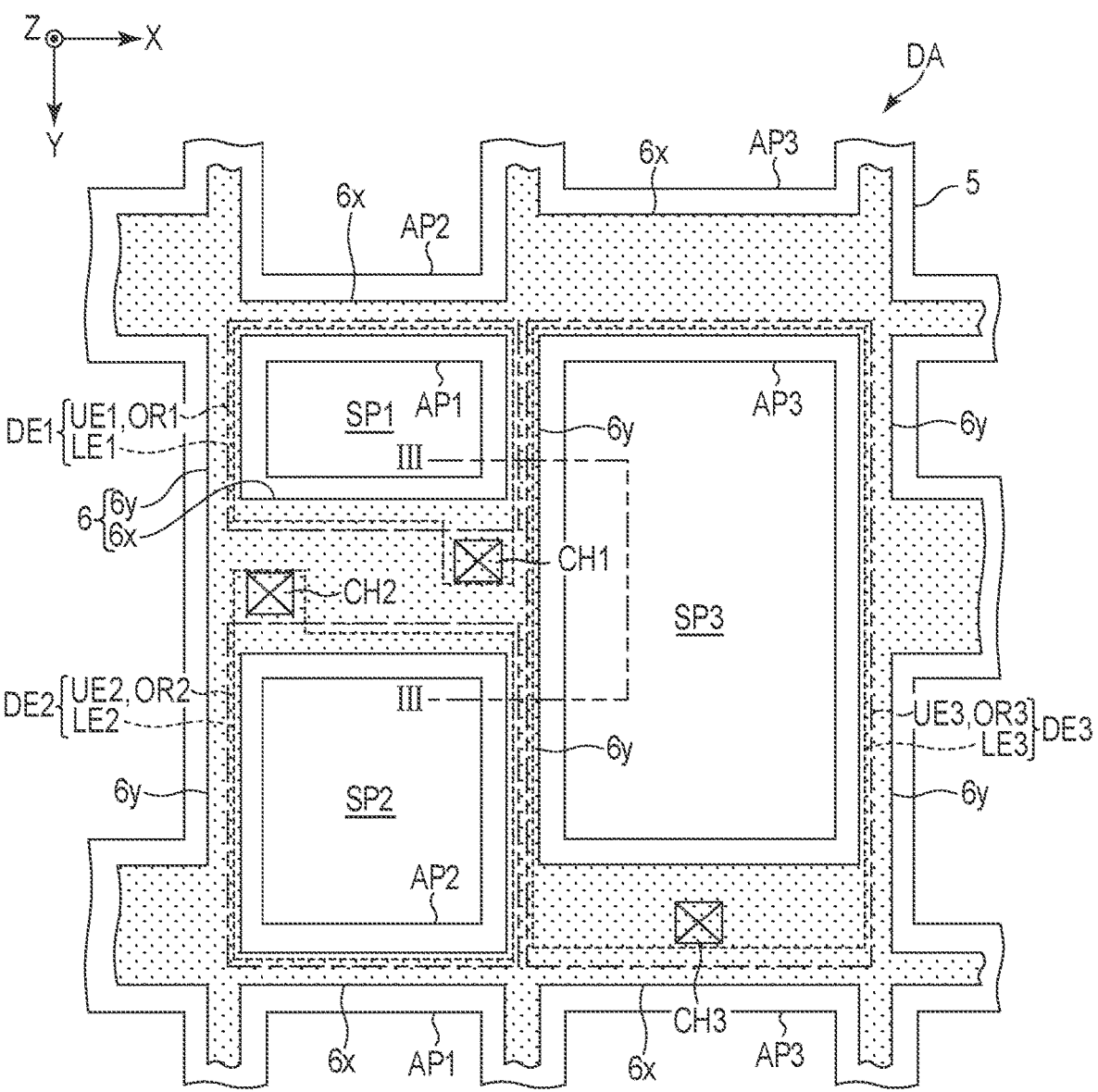
F I G. 2

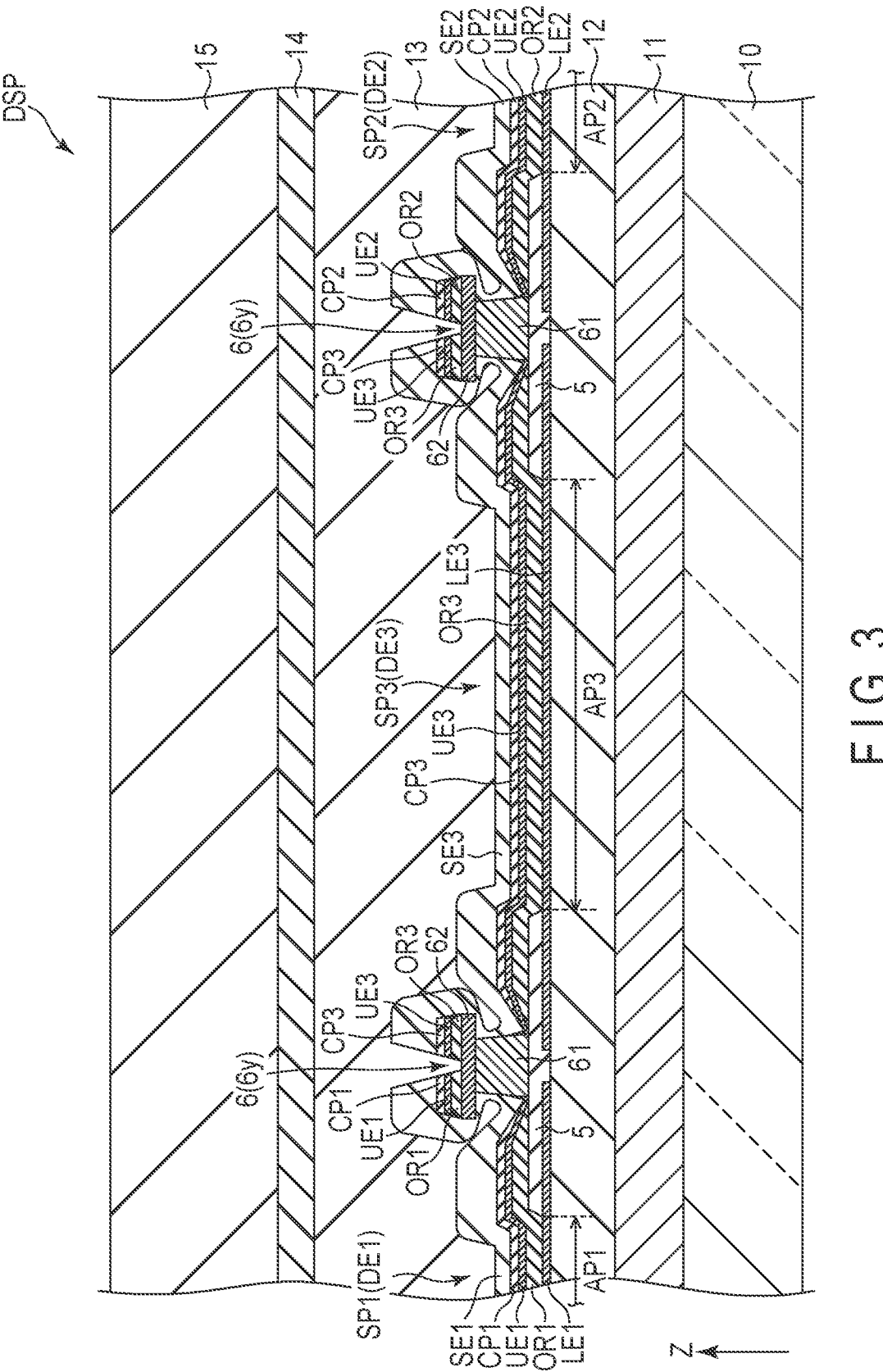
F I G. 3

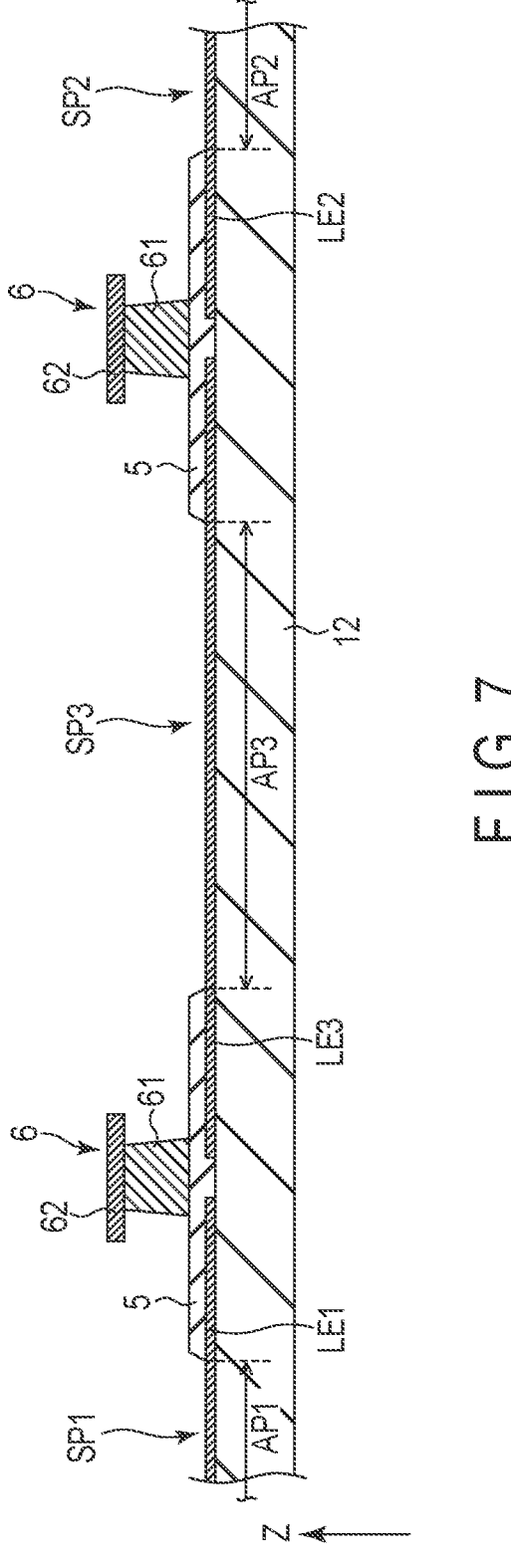
F I G. 7

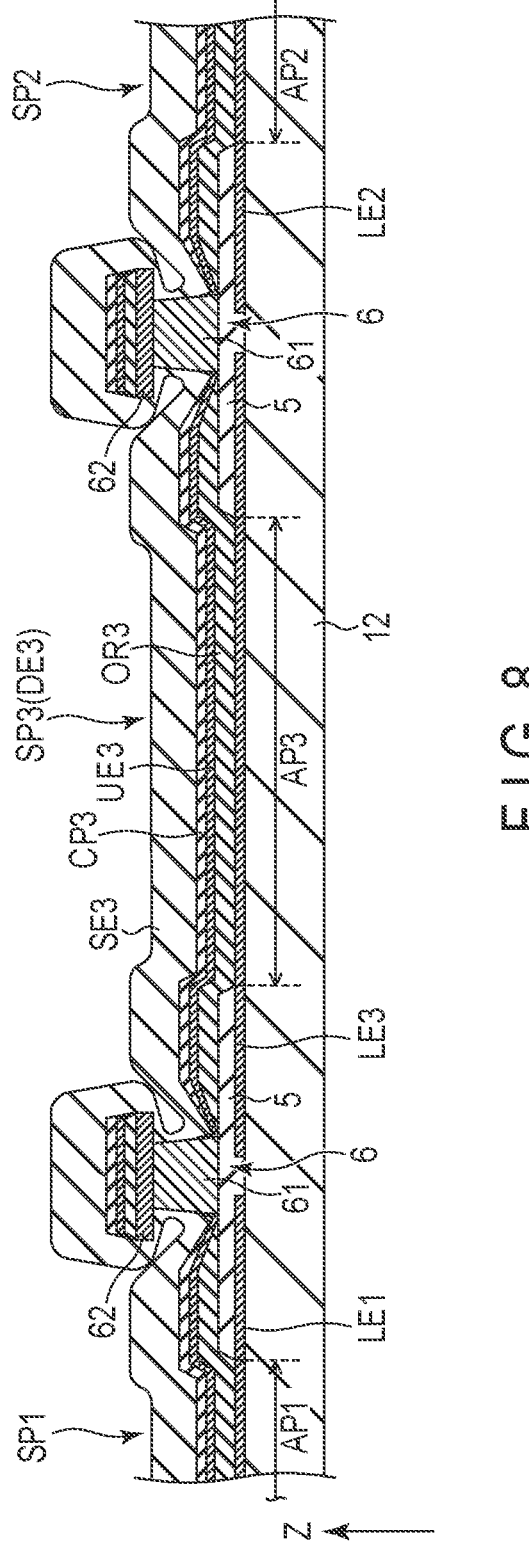
F I G. 8

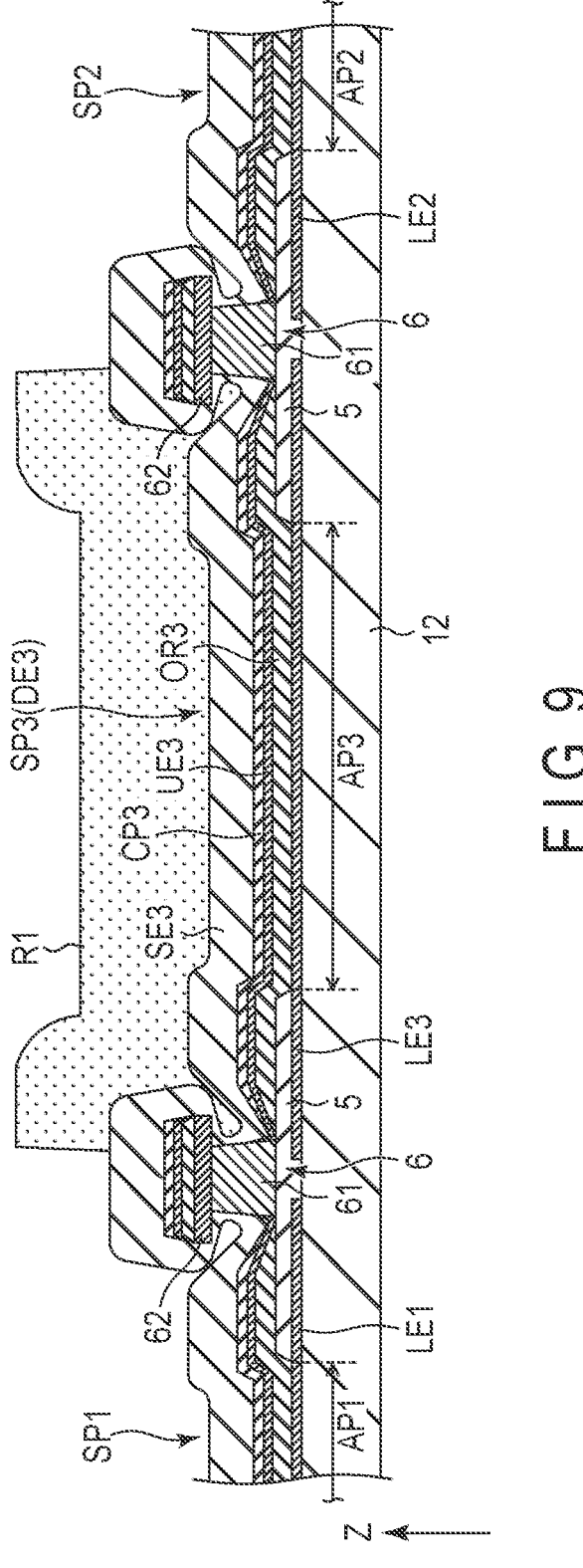
F I G. 9

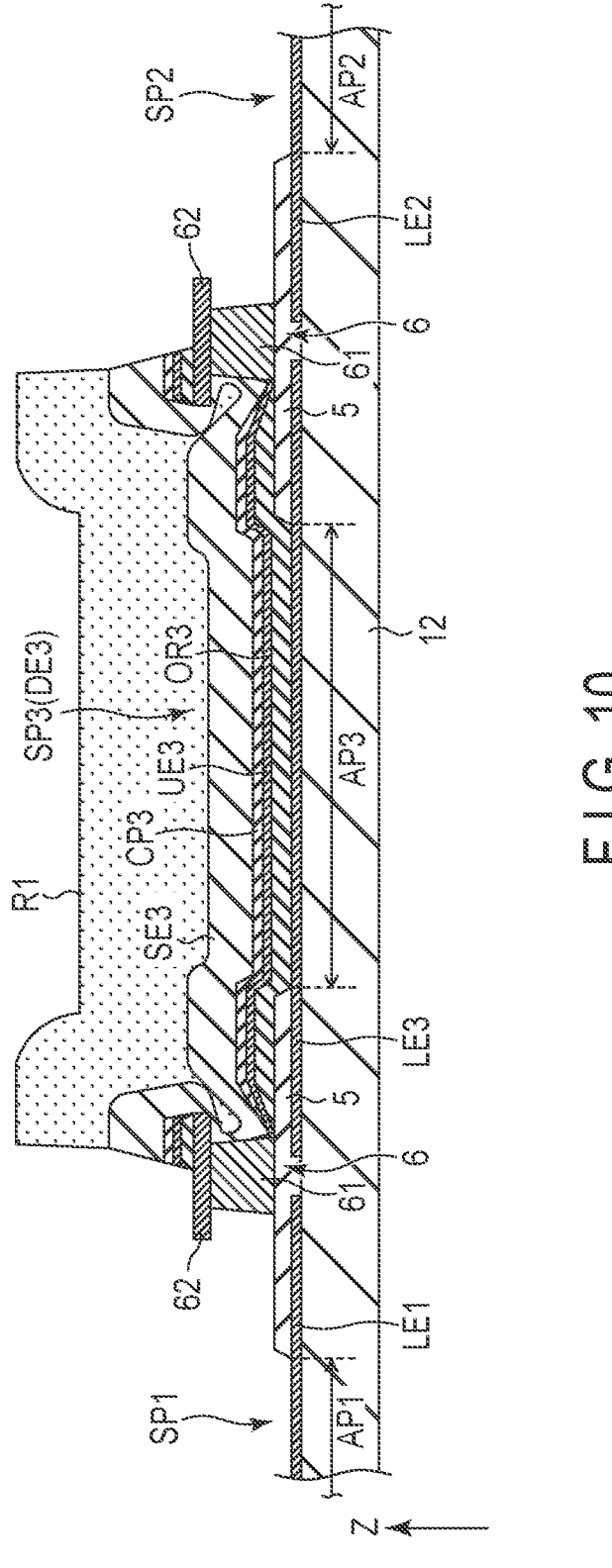
F I G. 10

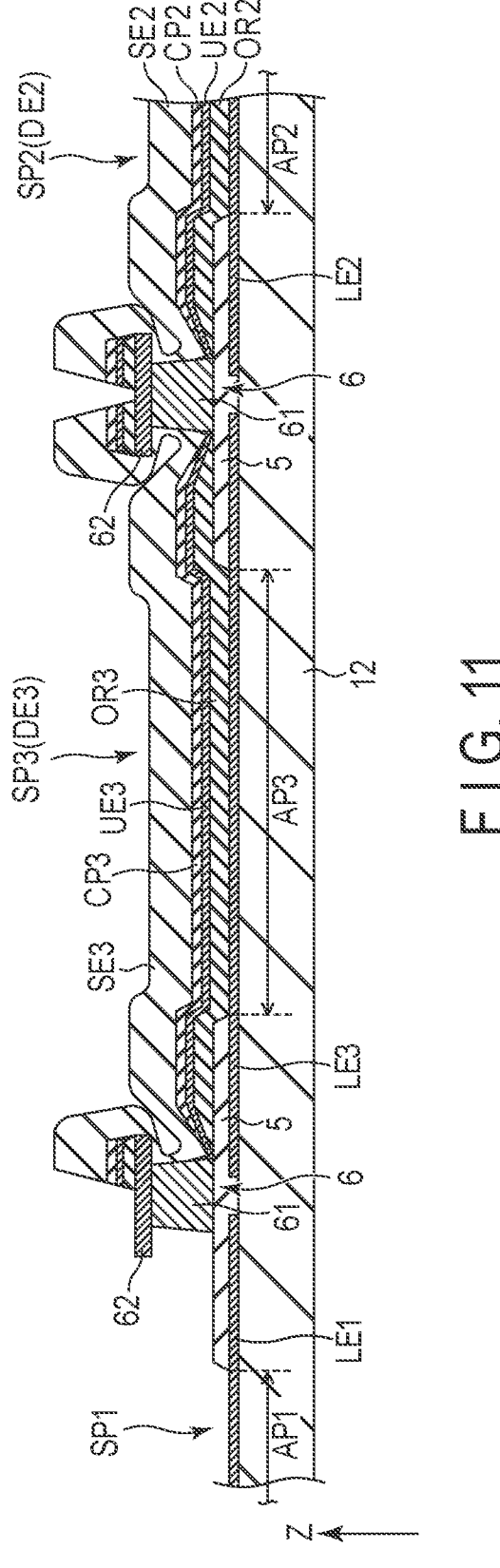
F I G. 11

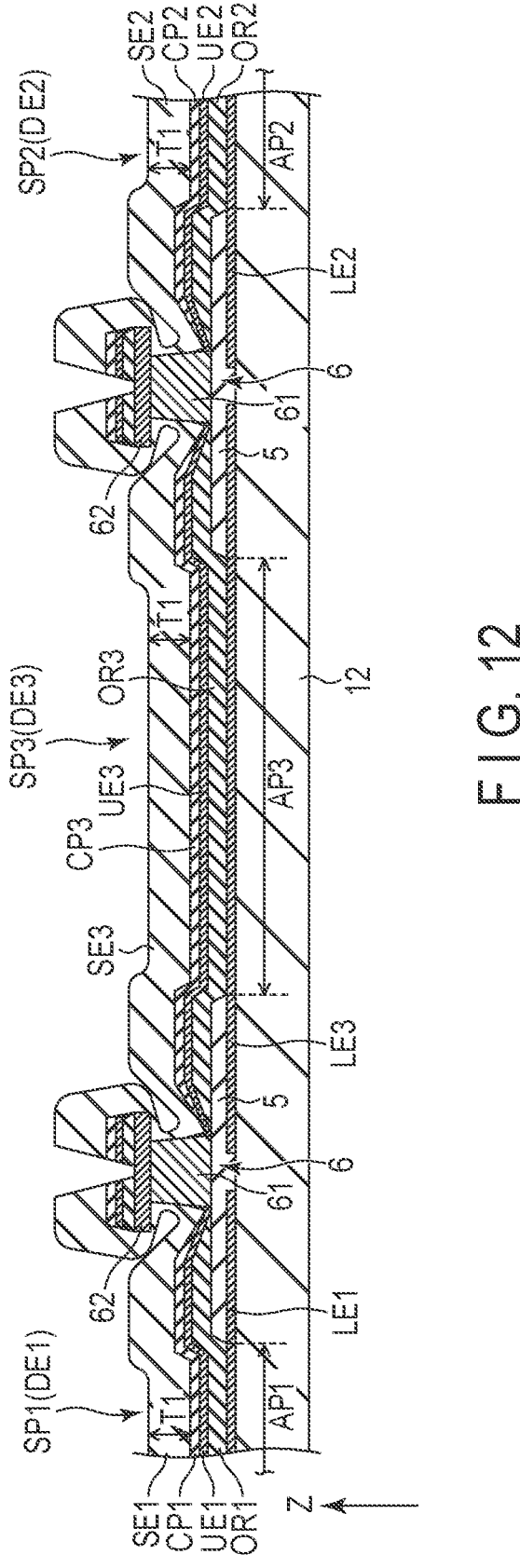
F I G. 12

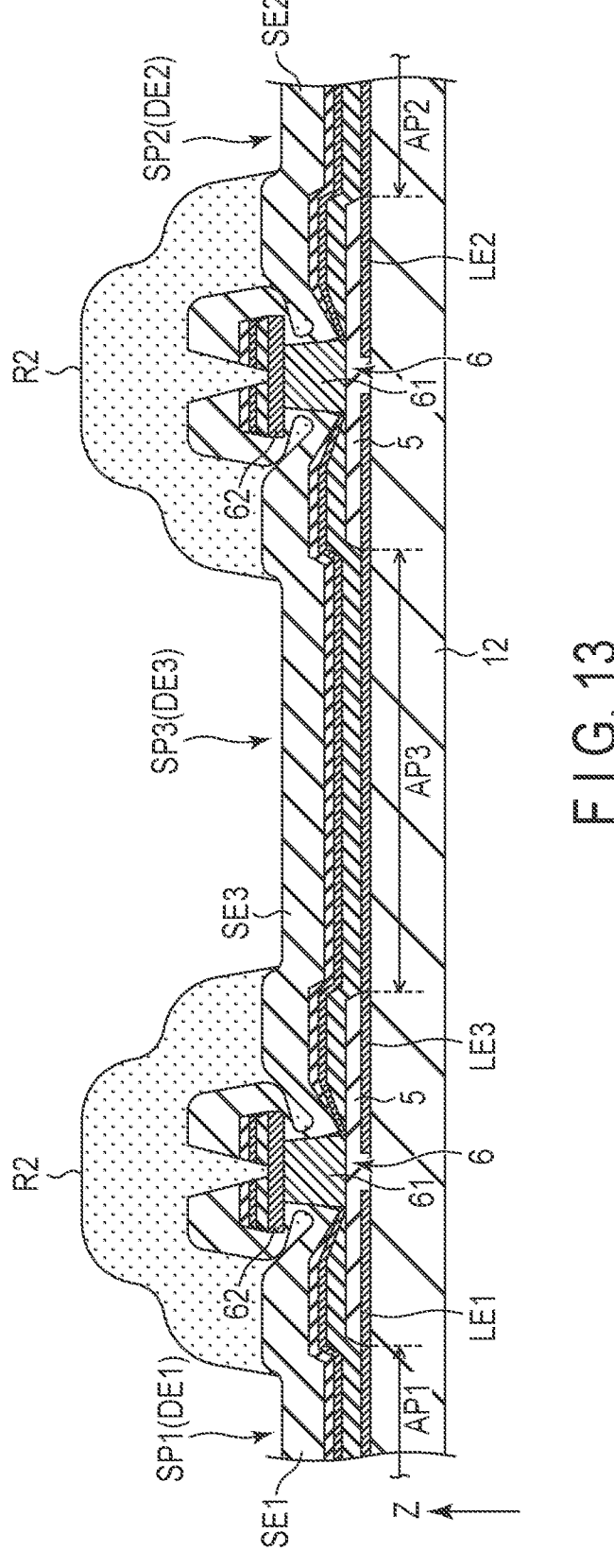
F I G. 13

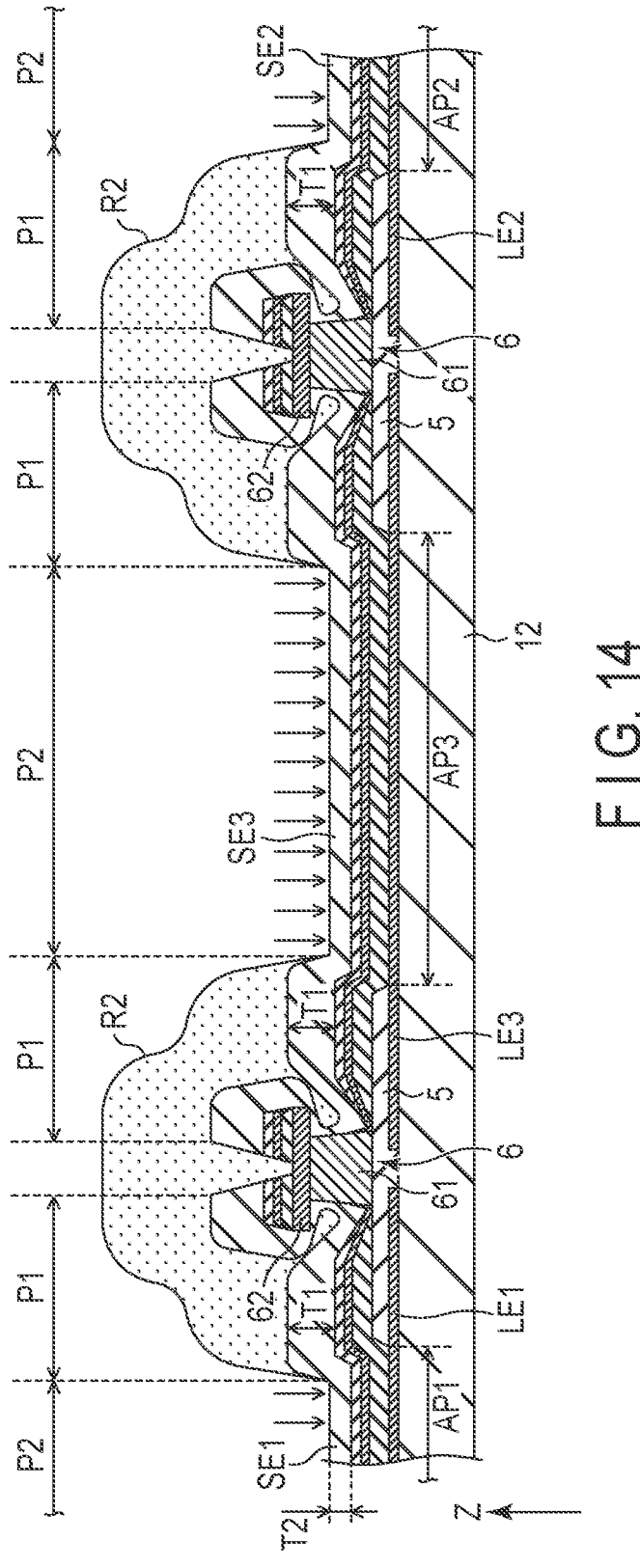
F I G. 14

DISPLAY DEVICE, INCLUDING A SEALING LAYER WITH DIFFERENT THICKNESSES AND MANUFACTURING METHOD THEREOF

CROSS-REFERENCE TO RELATED APPLICATIONS

This application is based upon and claims the benefit of priority from Japanese Patent Application No. 2022-070106, filed Apr. 21, 2022, the entire contents of which are incorporated herein by reference.

FIELD

Embodiments described herein relate generally to a display device and a manufacturing method thereof.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer. The organic layer emits light based on the potential difference between the lower electrode and the upper electrode.

In the display devices described above, the improvement of reliability for moisture and the improvement of display quality have been required.

BRIEF DESCRIPTION OF THE DRAWINGS

FIG. 1 is a diagram showing a configuration example of a display device according to an embodiment.

FIG. 2 is a diagram showing an example of the layout of subpixels.

FIG. 3 is a schematic cross-sectional view of the display device along the III-III line of FIG. 2.

FIG. 7 is a schematic cross-sectional view showing part of the manufacturing process of the display device.

FIG. 8 is a schematic cross-sectional view showing a process following FIG. 7.

FIG. 9 is a schematic cross-sectional view showing a process following FIG. 8.

FIG. 10 is a schematic cross-sectional view showing a process following FIG. 9.

FIG. 11 is a schematic cross-sectional view showing a process following FIG. 10.

FIG. 12 is a schematic cross-sectional view showing a process following FIG. 11.

FIG. 13 is a schematic cross-sectional view showing a process following FIG. 12.

FIG. 14 is a schematic cross-sectional view showing a process following FIG. 13.

DETAILED DESCRIPTION

Figure 4:
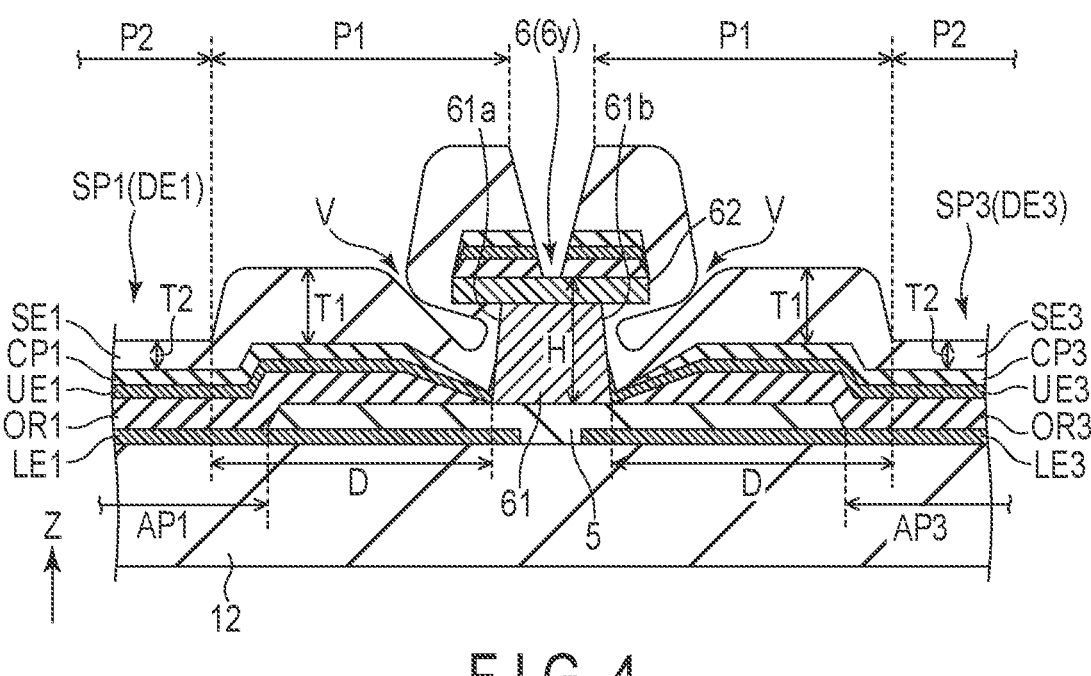
FIG. 4 is a schematic cross-sectional view in which a partition and its vicinity are enlarged.

In general, according to one embodiment, a display device comprises a lower electrode, a rib which covers an end portion of the lower electrode and comprises a pixel aperture from which part of the lower electrode is exposed, a partition provided on the rib, an upper electrode which faces the lower electrode and is in contact with the partition, an organic layer which is provided between the lower electrode and the upper electrode and emits light based on a potential difference between the lower electrode and the upper electrode, and a sealing layer which continuously covers a display element and the partition, the display element including the lower electrode, the upper electrode and the organic layer. The sealing layer includes a first portion which is located above the rib and has a first thickness, and a second portion which is located above the lower electrode exposed from the rib through the pixel aperture and has a second thickness less than the first thickness.

According to another embodiment, a manufacturing method of a display device includes forming a lower electrode above a substrate, forming a rib which covers an end portion of the lower electrode and comprises a pixel aperture from which part of the lower electrode is exposed, forming a partition on the rib, forming an organic layer which covers the lower electrode through the pixel aperture, forming an upper electrode which covers the organic layer and is in contact with the partition, forming a sealing layer which continuously covers a display element and the partition, the display element including the lower electrode, the upper electrode and the organic layer, and reducing a thickness of, of the sealing layer, a portion located above the lower electrode exposed from the rib through the pixel aperture.

The embodiments can provide a display device in which the reliability for moisture and the display quality can be improved, and a manufacturing method thereof.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. A plan view is defined as appearance when various types of elements are viewed parallel to the third direction Z. When this specification uses terms indicating the positional relationships of two or more elements, such as "on", "above" and "face" in phrases "an element is provided on another element", "an element is provided above another element" and "an element faces another element", the two or more elements may be directly in contact with each other, or a gap or another element may be interposed between the elements.

The display device of each embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP according to an embodiment. The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a red first subpixel SP1, a green second subpixel SP2 and a blue third subpixel SP3. Each pixel PX may include a subpixel SP which exhibits another color such as white in addition to subpixels SP1, SP2 and SP3 or instead of one of subpixels SP1, SP2 and SP3. The number of subpixels SP constituting each pixel PX may be less than or equal to two.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE. The display element DE is an organic light emitting diode (OLED) as a light emitting element.

It should be noted that the configuration of the pixel circuit 1 is not limited to the example shown in the figure. For example, the pixel circuit 1 may comprise more thin-film transistors and capacitors.

FIG. 2 is a diagram showing an example of the layout of subpixels SP1, SP2 and SP3. In the example of FIG. 2, the first subpixel SP1 and the third subpixel SP3 are arranged in the first direction X. The second subpixel SP2 and the third subpixel SP3 are also arranged in the first direction X. Further, the first subpixel SP1 and the second subpixel SP2 are arranged in the second direction Y.

When subpixels SP1, SP2 and SP3 are provided in line with this layout, in the display area DA, a column in which subpixels SP1 and SP2 are alternately provided in the second direction Y and a column in which a plurality of third subpixels SP3 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises a first pixel aperture AP1 in the first subpixel SP1, comprises a second pixel aperture AP2 in the second subpixel SP2 and comprises a third pixel aperture AP3 in the third subpixel SP3. In the example of FIG. 2, the second pixel aperture AP2 is larger than the first pixel aperture AP1, and the third pixel aperture AP3 is larger than the second pixel aperture AP2.

The partition 6 is provided in the boundary between adjacent subpixels SP and overlaps the rib 5 as seen in plan view. The partition 6 comprises a plurality of first partitions 6x extending in the first direction X and a plurality of second partitions 6y extending in the second direction Y. The first partitions 6x are provided between the pixel apertures AP1 and AP2 which are adjacent to each other in the second direction Y and between two third pixel apertures AP3 which are adjacent to each other in the second direction Y. Each second partition 6y is provided between the pixel apertures AP1 and AP3 which are adjacent to each other in the first direction X and between the pixel apertures AP2 and AP3 which are adjacent to each other in the first direction X.

In the example of FIG. 2, the first partitions 6x and the second partitions 6y are connected to each other. In this configuration, the partition 6 has a grating shape surrounding the pixel apertures AP1, AP2 and AP3 as a whole. In other words, the partition 6 comprises apertures in subpixels SP1, SP2 and SP3 in a manner similar to that of the rib 5.

The first subpixel SP1 comprises a first lower electrode LE1, a first upper electrode UE1 and a first organic layer OR1 overlapping the first pixel aperture AP1. The second subpixel SP2 comprises a second lower electrode LE2, a second upper electrode UE2 and a second organic layer OR2 overlapping the second pixel aperture AP2. The third subpixel SP3 comprises a third lower electrode LE3, a third upper electrode UE3 and a third organic layer OR3 overlapping the third pixel aperture AP3.

The first lower electrode LE1, the first upper electrode UE1 and the first organic layer OR1 constitute the first display element DE1 of the first subpixel SP1. The second lower electrode LE2, the second upper electrode UE2 and the second organic layer OR2 constitute the second display element DE2 of the second subpixel SP2. The third lower electrode LE3, the third upper electrode UE3 and the third organic layer OR3 constitute the third display element DE3 of the third subpixel SP3. Each of the display elements DE1, DE2 and DE3 may include a cap layer as described later.

For example, the first display element DE1 emits light in a red wavelength range. The second display element DE2 emits light in a green wavelength range. The third display element DE3 emits light in a blue wavelength range.

The first lower electrode LE1 is connected to the pixel circuit 1 (see FIG. 1) of the first subpixel SP1 through a first contact hole CH1. The second lower electrode LE2 is connected to the pixel circuit 1 of the second subpixel SP2 through a second contact hole CH2. The third lower electrode LE3 is connected to the pixel circuit 1 of the third subpixel SP3 through a third contact hole CH3.

In the example of FIG. 2, the contact holes CH1 and CH2 entirely overlap the first partition 6x between the pixel apertures AP1 and AP2 which are adjacent to each other in the second direction Y. The third contact hole CH3 entirely overlaps the first partition 6x between two third pixel apertures AP3 which are adjacent to each other in the second direction Y. As another example, at least part of the contact hole CH1, CH2 or CH3 may not overlap the first partition 6x.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1.

The circuit layer 11 is covered with an organic insulating layer 12. The organic insulating layer 12 functions as a planarization film which planarizes the irregularities formed by the circuit layer 11. Although not shown in the section of FIG. 3, all of the contact holes CH1, CH2 and CH3 described above are provided in the organic insulating layer 12.

The lower electrodes LE1, LE2 and LE3 are provided on the organic insulating layer 12. The rib 5 is provided on the organic insulating layer 12 and the lower electrodes LE1, LE2 and LE3. The end portions of the lower electrodes LE1, LE2 and LE3 are covered with the rib 5.

The partition 6 includes a conductive lower portion 61 provided on the rib 5 and an upper portion 62 provided on the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 is called an overhang shape.

The first organic layer OR1 covers the first lower electrode LE1 through the first pixel aperture AP1. The first upper electrode UE1 covers the first organic layer OR1 and faces the first lower electrode LE1. The second organic layer OR2 covers the second lower electrode LE2 through the second pixel aperture AP2. The second upper electrode UE2 covers the second organic layer OR2 and faces the second lower electrode LE2. The third organic layer OR3 covers the third lower electrode LE3 through the third pixel aperture AP3. The third upper electrode UE3 covers the third organic layer OR3 and faces the third lower electrode LE3.

In the example of FIG. 3, a first cap layer CP1 is provided on the first upper electrode UE1. A second cap layer CP2 is provided on the second upper electrode UE2. A third cap layer CP3 is provided on the third upper electrode UE3. The cap layers CP1, CP2 and CP3 adjust the optical property of the light emitted from the organic layers OR1, OR2 and OR3, respectively.

The first organic layer OR1, the first upper electrode UE1 and the first cap layer CP1 are partly located on the upper portion 62. These portions are spaced apart from the other portions of the first organic layer OR1, the first upper electrode UE1 and the first cap layer CP1. Similarly, the second organic layer OR2, the second upper electrode UE2 and the second cap layer CP2 are partly located on the second portion 62, and these portions are spaced apart from the other portions of the second organic layer OR2, the second upper electrode UE2 and the second cap layer CP2. Further, the third organic layer OR3, the third upper electrode UE3 and the third cap layer CP3 are partly located on the upper portion 62, and these portions are spaced apart from the other portions of the third organic layer OR3, the third upper electrode UE3 and the third cap layer CP3.

A first sealing layer SE1 is provided in the first subpixel SP1. A second sealing layer SE2 is provided in the second subpixel SP2. A third sealing layer SE3 is provided in the third subpixel SP3. The first sealing layer SE1 continuously covers the first cap layer CP1 and the partition 6 around the first subpixel SP1. The second sealing layer SE2 continuously covers the second cap layer CP2 and the partition 6 around the second subpixel SP2. The third sealing layer SE3 continuously covers the third cap layer CP3 and the partition 6 around the third subpixel SP3.

The end portions (peripheral portions) of the sealing layers SE1, SE2 and SE3 are located above the upper portions 62. In the example of FIG. 3, the end portions of the sealing layers SE1 and SE3 located above the upper portion 62 of the partition 6 between subpixels SP1 and SP3 are spaced apart from each other. The end portions of the sealing layers SE2 and SE3 located above the upper portion 62 of the partition 6 between subpixels SP2 and SP3 are spaced apart from each other.

The sealing layers SE1, SE2 and SE3 are covered with a resin layer 13. The resin layer 13 is covered with a sealing layer 14. Further, the sealing layer 14 is covered with a resin layer 15.

The organic insulating layer 12 and the resin layers 13 and 15 are formed of an organic material. The rib 5 and the sealing layers 14, SE1, SE2 and SE3 are formed of, for example, an inorganic material such as silicon nitride (SiN), silicon oxide (SiO) or silicon oxynitride (SiON).

Each of the lower electrodes LE1, LE2 and LE3 comprises an intermediate layer formed of, for example, silver (Ag), and a pair of conductive oxide layers covering the upper and lower surfaces of the intermediate layer. Each conductive oxide layer may be formed of, for example, a transparent conductive oxide such as indium tin oxide (ITO), indium zinc oxide (IZO) or indium gallium zinc oxide (IGZO).

The upper electrodes UE1, UE2 and UE3 are formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

Each of the organic layers OR1, OR2 and OR3 includes a plurality of functional layers and a light emitting layer. For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer. It should be noted that the configuration of the organic layer OR1, OR2 or OR3 is not limited to this example. One of the functional layers described above may be omitted. Another functional layer may be added.

The cap layers CP1, CP2 and CP3 are formed of, for example, a multilayer body of a plurality of transparent thin films. As the thin films, the multilayer body may include a thin film formed of an inorganic material and a thin film formed of an organic material. These thin films have refractive indices different from each other. The materials of the thin films constituting the multilayer body are different from those of the upper electrodes UE1, UE2 and UE3 and are also different from those of the sealing layers SE1, SE2 and SE3. It should be noted that at least one of the cap layers CP1, CP2 and CP3 may be omitted.

The lower portion 61 of the partition 6 is formed of, for example, aluminum (Al). The lower portion 61 may be formed of an aluminum alloy such as an aluminum-neodymium alloy (AlNd) or may comprise a multilayer structure consisting of an aluminum layer and an aluminum alloy layer. Further, the lower portion 61 may comprise a thin film formed of a metal material different from aluminum and an aluminum alloy under the aluminum layer or the aluminum alloy layer. This thin film can be formed of, for example, molybdenum (Mo).

For example, the upper portion 62 of the partition 6 comprises a multilayer structure consisting of a first thin film formed of a metal material such as titanium (Ti) and a second thin film formed of conductive oxide such as ITO. The upper portion 62 may comprise a single-layer structure of a metal material such as titanium. The upper portion 62 may comprise a single-layer structure of an inorganic material such as silicon oxide.

Common voltage is applied to the partition 6. This common voltage is applied to the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the first lower electrode LE1 and the first upper electrode UE1, the light emitting layer of the first organic layer OR1 emits light in a red wavelength range. When a potential difference is formed between the second lower electrode LE2 and the second upper electrode UE2, the light emitting layer of the second organic layer OR2 emits light in a green wavelength range. When a potential difference is formed between the third lower electrode LE3 and the third upper electrode UE3, the light emitting layer of the third organic layer OR3 emits light in a blue wavelength range.

FIG. 4 is a schematic cross-sectional view in which the partition 6 provided between subpixels SP1 and SP3 and its vicinity are enlarged. In this figure, the substrate 10, the circuit layer 11, the resin layer 13, the sealing layer 14 and the resin layer 15 are omitted.

The lower portion 61 comprises a pair of side surfaces 61$a$ and 61$b$. The both end portions of the upper portion 62 protrude relative to the side surfaces 61$a$ and 61$b$. In the example of FIG. 4, the lower portion 61 is shaped so as to taper toward the upper portion 62. In other words, the side surfaces 61$a$ and 61$b$ incline with respect to a third direction Z such that the distance between them is decreased toward the upper portion 62. As another example, the side surfaces 61$a$ and 61$b$ may be substantially parallel to the third direction Z.

Depending on the condition for forming the first sealing layer SE1, a void V which is not filled with the first sealing layer SE1 could be formed near the side surface 61$a$. Similarly, depending on the condition for forming the third sealing layer SE3, a void V which is not filled with the third sealing layer SE3 could be formed near the side surface 61$b$.

The first sealing layer SE1 includes a first portion P1 having a first thickness T1 and a second portion P2 having a second thickness T2. A large part of the first portion P1 is located above the rib 5. The first portion P1 continuously covers the first cap layer CP1, part of the side surface 61$a$ of the lower portion 61, the bottom surface and the side surface of the upper portion 62, etc. The second portion P2 is located above the first pixel aperture AP1 (in other words, above the first lower electrode LE1 which is exposed from the rib 5 through the first pixel aperture AP1). In the example of FIG. 4, the boundary between the first portion P1 and the second portion P2 is located above the first pixel aperture AP1. As another example, the boundary may be located above the rib 5.

The thickness of the first portion P1 is not constant and may be changed based on the shape of the base. In the example of FIG. 4, the thickness of the first portion P1 is reduced around the void V. For example, the first thickness T1 is the mean value of the thicknesses of some parts of the first portion P1. As another example, the first thickness T1 may be the thickness of the part excluding the vicinity of the void V from the first portion P1 or the mean value of the thicknesses of such parts.

Regarding the second portion P2, the base is relatively flat and the thickness is almost constant. For example, the second thickness T2 is the mean value of the thicknesses of some parts of the second portion P2. When the base of the second portion P2 have irregularities, for example, near the end portion of the rib 5, the second thickness T2 may be the thickness of the part excluding the vicinity of the irregularities or the mean value of the thicknesses of such parts.

In the present embodiment, the second thickness T2 is less than the first thickness T1 (T2<T1). For example, the second thickness T2 is less than or equal to half the first thickness T1. For example, the first thickness T1 is greater than or equal to 1.0 μm, and the second thickness T2 is less than 1.0 μm. The second thickness T2 should be preferably greater than or equal to 0.1 μm.

The distance D between the partition 6 and the second portion P2 should be preferably greater than or equal to the height H of the partition 6 (D≥H). Here, distance D is equivalent to the distance between the lower end of the side surface 61$a$ and the second portion P2 of the first sealing layer SE1 in the width direction of the partition 6. The width direction of the partition 6 is the first direction X with respect to the second partition 6$y$ shown in FIG. 4 and is the second direction Y with respect to the first partition 6$x$ shown in FIG. 2. Height H is equivalent to the distance from the upper surface of the rib 5 to the upper surface of the upper portion 62 in the third direction Z, and is, for example, greater than or equal to 1.0 μm.

The relationship of distance D≥height H should be preferably established over the whole circumference of the second portion P2. It should be noted that this relationship may not be established in at least part of the circumference of the second portion P2.

In a manner similar to that of the first sealing layer SE1, each of the second sealing layer SE2 and the third sealing layer SE3 includes a first portion P1 and a second portion P2. The relationship between the first thickness T1 and the second thickness T2 and the relationship between height H and distance D in the sealing layers SE2 and SE3 are the same as the above explanation regarding the first sealing layer SE1. However, the first thicknesses T1 of the sealing layers SE1, SE2 and SE3 may be different from each other. The second thicknesses T2 of the sealing layers SE1, SE2 and SE3 may be different from each other. Distances D of the sealing layers SE1, SE2 and SE3 may be different from each other.

Figure 5:
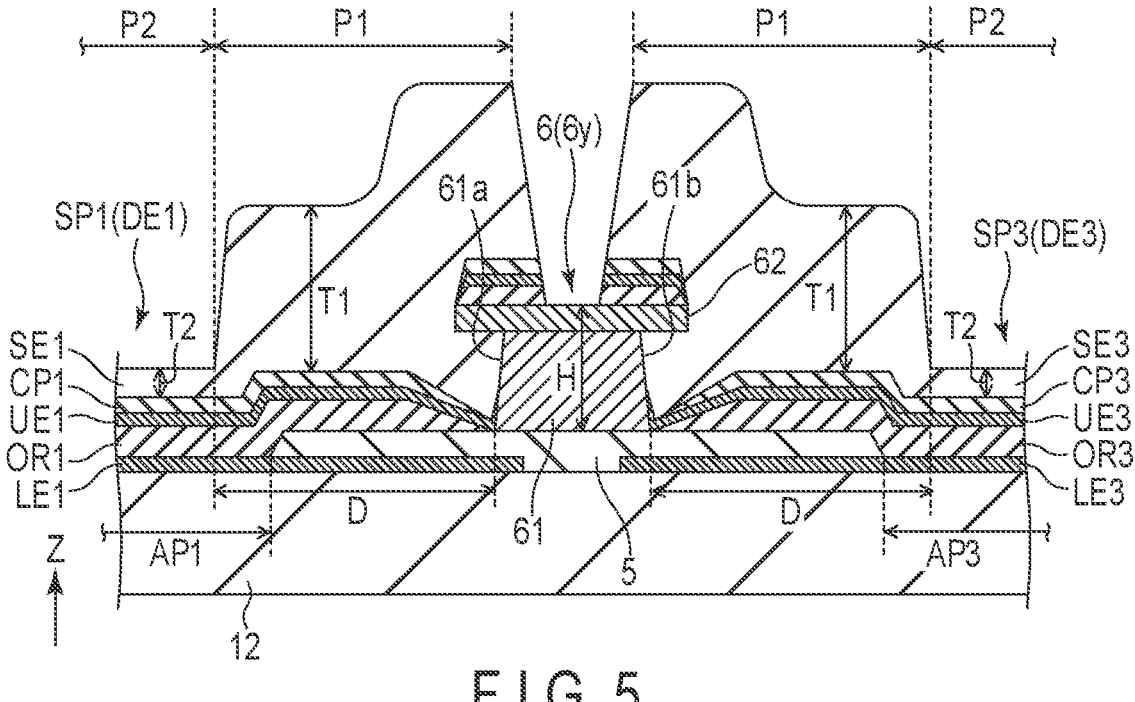
FIG. 5 is a schematic cross-sectional view showing another example which could be applied to the partition and its vicinity.

FIG. 5 is a schematic cross-sectional view showing another example which could be applied to the partition 6 and its vicinity. In the example of FIG. 4 described above, both the first thickness T1 and the second thickness T2 are less than height H (T1, T2<H). In the example of FIG. 5, the first thickness T1 is greater than height H (T1>H), and the second thickness T2 is less than height H (T2<H).

In the example of FIG. 5, the first thickness T1 is, for example, greater than or equal to 1.0 μm, and is, for example, approximately 3.0 μm. In a case where the sealing layers SE1, SE2 and SE3 are formed so as to be thick in this way, the second thickness T2 may be, for example, less than or equal to a third of the first thickness T1.

Figure 6:
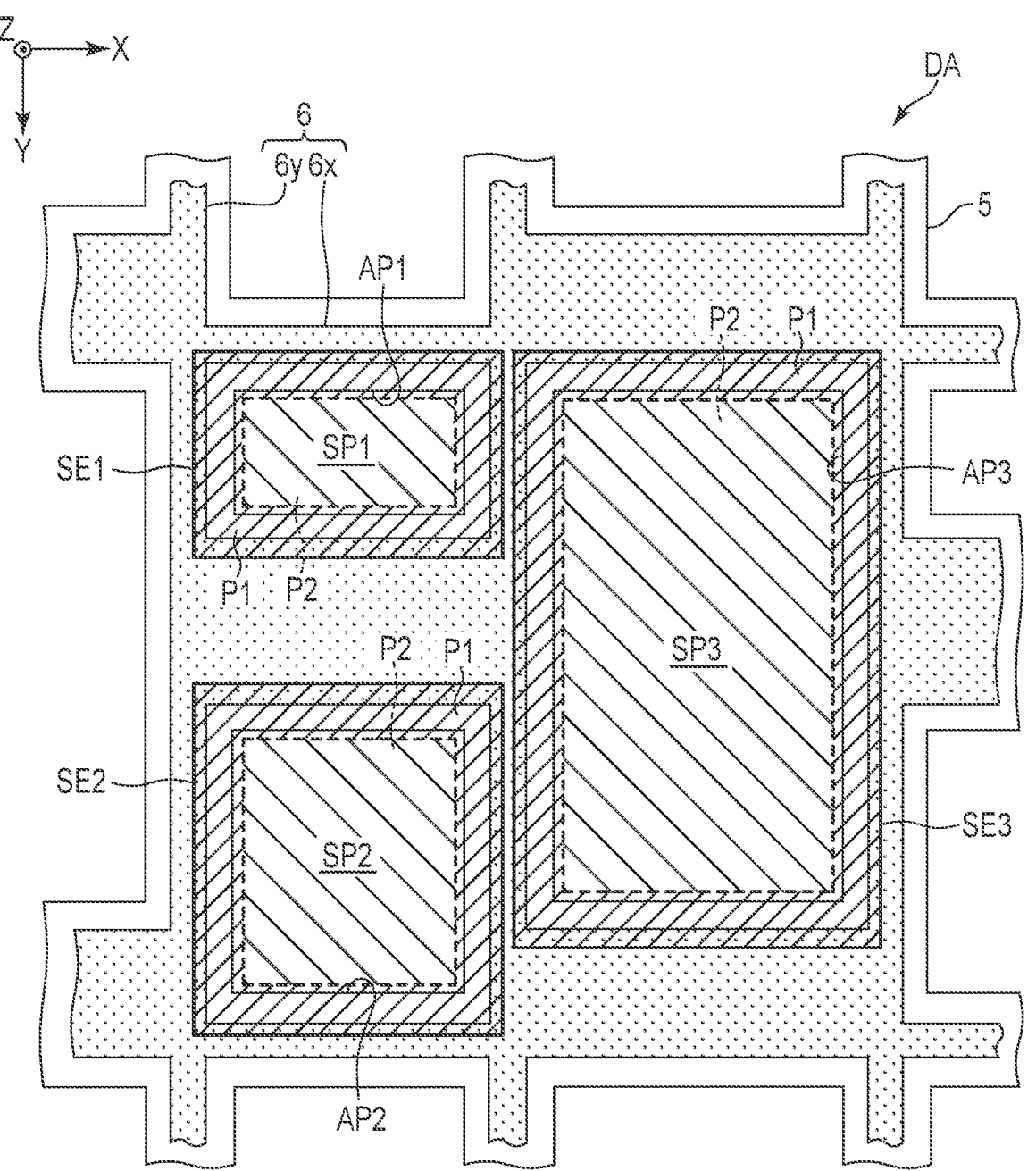
FIG. 6 is a schematic plan view of the partition, a rib and sealing layers.

FIG. 6 is a schematic plan view of the partition 6, the rib 5 and the sealing layers SE1, SE2 and SE3. In the sealing layers SE1, SE2 and SE3 shown in FIG. 6, the areas indicated by rising diagonal strokes from bottom left to top right correspond to the first portions P1, and the areas indicated by rising diagonal strokes from bottom right to top left correspond to the second portions P2.

The broken lines forming a rectangle in each of the sealing layers SE1, SE2 and SE3 indicate the boundary between the first portion P1 and the second portion P2. In the example of FIG. 6, these boundaries overlap the pixel apertures AP1, AP2 and AP3. In other words, in the example of FIG. 6, the area of the second portion P2 of the first sealing layer SE1 is slightly less than that of the first pixel aperture AP1. The area of the second portion P2 of the second sealing layer SE2 is slightly less than that of the second pixel aperture AP2. The area of the second portion P2 of the third sealing layer SE3 is slightly less than that of the third pixel aperture AP3. As another example, these boundaries may overlap the rib 5 around the pixel apertures AP1, AP2 and AP3.

The first portion P1 of the first sealing layer SE1 surrounds the second portion P2 of the first sealing layer SE1 and overlaps the rib 5 and the partition 6 around the first pixel aperture AP1. The first portion P1 of the second sealing layer SE2 surrounds the second portion P2 of the second sealing layer SE2 and overlaps the rib 5 and the partition 6 around the second pixel aperture AP2. The first portion P1 of the third sealing layer SE3 surrounds the second portion P2 of the third sealing layer SE3 and overlaps the rib 5 and the partition 6 around the third pixel aperture AP3.

Now, this specification explains the manufacturing method of the display device DSP. In the present embodiment, for example, this specification assumes a case where the third display element DE3 is formed firstly, and the second display element DE2 is formed secondly, and the first display element DE1 is formed lastly. It should be noted that the formation order of the display elements DE1, DE2 and DE3 is not limited to this example.

FIG. 7 to FIG. 14 are schematic cross-sectional views showing part of the manufacturing method of the display device DSP in the present embodiment. In these figures, the substrate 10 and the circuit layer 11 are omitted.

To manufacture the display device DSP, first, the circuit layer 11 and the organic insulating layer 12 are formed on the substrate 10 shown in FIG. 3. Subsequently, as shown in FIG. 7, the lower electrodes LE1, LE2 and LE3 are formed on the organic insulating layer 12. The rib 5 is formed on the organic insulating layer 12 and the lower electrodes LE1, LE2 and LE3. The partition 6 is formed on the rib 5. The pixel apertures AP1, AP2 and AP3 of the rib 5 may be formed before the partition 6 or may be formed after the partition 6.

Subsequently, the third organic layer OR3, the third upper electrode UE3, the third cap layer CP3 and the third sealing layer SE3 are formed in order by vapor deposition for the entire substrate as shown in FIG. 8. At this time, the third organic layer OR3, the third upper electrode UE3 and the third cap layer CP3 formed in subpixels SP1, SP2 and SP3 are divided by the partition 6 having an overhang shape. The third sealing layer SE3 continuously covers the third display element DE3 including the third lower electrode LE3, the third organic layer OR3, the third upper electrode UE3 and the third cap layer CP3 and the partition 6.

Subsequently, as shown in FIG. 9, a resist R1 is provided on the third sealing layer SE3. The resist R1 has been patterned so as to overlap the third subpixel SP3. The resist R1 is also located immediately above, of the partition 6 surrounding the third subpixel SP3, a portion which is close to the third subpixel SP3.

Further, of the third organic layer OR3, the third upper electrode UE3, the third cap layer CP3 and the third sealing layer SE3, the portions exposed from the resist R1 are removed as shown in FIG. 10 by etching using the resist R1 as a mask. This process enables the acquisition of the following substrate. In the third subpixel SP3, the third display element DE3 including the third lower electrode LE3, the third organic layer OR3, the third upper electrode UE3 and the third cap layer CP3 is formed, and the third sealing layer SE3 which covers the third display element DE3 is also formed. No display element or sealing layer is formed in subpixel SP1 or SP2.

Subsequently, the resist R1 is removed, and a process for forming the second display element DE2 in the second subpixel SP2 is performed by a procedure similar to that of the third display element DE3. This process enables the acquisition of the following substrate. As shown in FIG. 11, further, in the second subpixel SP2, the second display element DE2 including the second lower electrode LE2, the second organic layer OR2, the second upper electrode UE2 and the second cap layer CP2 is formed, and the second sealing layer SE2 which covers the second display element DE2 is also formed.

After the formation of the second display element DE2, a process for forming the first display element DE1 in the first subpixel SP1 is performed by a procedure similar to that of the third display element DE3. This process enables the acquisition of the following substrate. As shown in FIG. 12, further, in the first subpixel SP1, the first display element DE1 including the first lower electrode LE1, the first organic layer OR1, the first upper electrode UE1 and the first cap layer CP1 is formed, and the first sealing layer SE1 which covers the first display element DE1 is also formed. In the state of FIG. 12, each of the thicknesses of the sealing layers SE1, SE2 and SE3 is the first thickness T1 described above overall.

Subsequently, as shown in FIG. 13, a resist R2 is provided on, of the sealing layers SE1, SE2 and SE3, a portion which covers the partition 6 (a portion corresponding to the first portion P1 described above). The resist R2 is also located above the rib 5 which protrudes to the both sides of the partition 6.

Further, the thicknesses of, of the sealing layers SE1, SE2 and SE3, the portions exposed from the resist R2 are reduced by etching using the resist R2 as a mask as shown in FIG. 14. This etching is, for example, dry etching, and is continued until the thicknesses of, of the sealing layers SE1, SE2 and SE3, the portions exposed from the resist R2 are reduced to the second thickness T2 described above. For example, this dry etching is stopped based on the elapse of a predetermined time. It should be noted that the thicknesses of the sealing layers SE1, SE2 and SE3 may be reduced by wet etching instead of dry etching.

Through these process shown in FIG. 13 and FIG. 14, the first portion P1 and the second portion P2 are formed in the sealing layers SE1, SE2 and SE3. Subsequently, the resist R2 is removed, and the processes of forming the resin layer 13, the sealing layer 14 and the resin layer 15 are performed in series. In this way, the display device DSP comprising the structure shown in FIG. 3 is completed.

In the process explained above, after the formation of the display elements DE1, DE2 and DE3, the first portion P1 and the second portion P2 are provided in the sealing layers SE1, SE2 and SE3 at the same time. However, the first portion P1 and the second portion P2 may be provided in the sealing layers SE1, SE2 and SE3 in separate processes.

In the present embodiment explained above, each of the sealing layers SE1, SE2 and SE3 comprises the first portion P1 and the second portion P2 which is thinner than the first portion P1. The partition 6 is provided above the rib 5, and the bases of the sealing layers SE1, SE2 and SE3 change largely. By covering these areas with the thick portions P1, the impregnation of moisture into the display elements DE1, DE2 and DE3, etc., is effectively prevented. Thus, the reliability of the display device DSP for moisture can be enhanced.

To the contrary, above the pixel apertures AP1, AP2 and AP3, the bases of the sealing layers SE1, SE2 and SE3 are relatively flat. In these areas, a great thickness is not required for the sealing layer SE1, SE2 or SE3 in terms of the prevention of the impregnation of moisture. Thus, even when these areas are covered with the thin second portions P2, the impregnation of moisture into the display elements DE1, DE2 and DE3, etc., can be prevented.

If the sealing layers SE1, SE2 and SE3 provided above the pixel apertures AP1, AP2 and AP3 are thick, the optical property of the display elements DE1, DE2 and DE3 may be degraded. To the contrary, when the sealing layers SE1, SE2 and SE3 are thin above the pixel apertures AP1, AP2 and AP3 like the second portions P2, the optical property of the display elements DE1, DE2 and DE3 can be improved.

Thus, in the present embodiment, since each of the sealing layers SE1, SE2 and SE3 comprises the first and second portions P1 and P2 having different thicknesses, both the reliability for moisture and the display quality can be improved in the display device DSP.

As described above, for example, when the first thickness T1 is greater than or equal to 1.0 μm, the impregnation of moisture near the partition 6 can be satisfactorily prevented. When the second thickness T2 is less than 1.0 μm but greater than or equal to 0.1 μm, the optical property of the display elements DE1, DE2 and DE3 can be improved, and further, the impregnation of moisture near the pixel apertures AP1, AP2 and AP3 can be satisfactorily prevented.

If the second portion P2 is too close to the partition 6, the impregnation of moisture near the partition 6 may not be sufficiently prevented. For this reason, as described above, the distance D between the partition 6 and the second portion P2 should be preferably greater than or equal to the height H of the partition 6. By determining distance D in this manner, the impregnation of moisture can be more effectively prevented by the first portion P1.

Various desirable effects can be obtained from the present embodiment in addition to the examples shown here.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A display device comprising:
a lower electrode;
a rib which covers an end portion of the lower electrode and comprises a pixel aperture from which part of the lower electrode is exposed;
a partition provided on the rib;

an upper electrode which faces the lower electrode and is in contact with the partition;
an organic layer which is provided between the lower electrode and the upper electrode and emits light based on a potential difference between the lower electrode and the upper electrode; and
a sealing layer which continuously covers a display element and the partition, the display element including the lower electrode, the upper electrode and the organic layer, wherein
the sealing layer includes:
a first portion which is located above the rib and has a first thickness; and
a second portion which is located above the lower electrode exposed from the rib through the pixel aperture and has a second thickness less than the first thickness.

2. The display device of claim 1, wherein
the first portion surrounds the second portion as seen in plan view.

3. The display device of claim 1, wherein
the second thickness is less than or equal to half the first thickness.

4. The display device of claim 1, wherein
the first thickness is greater than a height of the partition, and
the second thickness is less than the height of the partition.

5. The display device of claim 1, wherein
the first thickness is greater than or equal to 1.0 μm, and
the second thickness is less than 1.0 μm.

6. The display device of claim 5, wherein
the second thickness is greater than or equal to 0.1 μm.

7. The display device of claim 1, wherein
a distance between the partition and the second portion is greater than or equal to a height of the partition.

8. The display device of claim 1, wherein
the partition comprises:
a lower portion provided on the rib; and
an upper portion provided on the lower portion and protruding relative to a side surface of the lower portion,
the upper electrode is in contact with the side surface, and
the first portion covers part of the side surface.

9. A manufacturing method of a display device, including:
forming a lower electrode above a substrate;
forming a rib which covers an end portion of the lower electrode and comprises a pixel aperture from which part of the lower electrode is exposed;
forming a partition on the rib;
forming an organic layer which covers the lower electrode through the pixel aperture;
forming an upper electrode which covers the organic layer and is in contact with the partition;
forming a sealing layer which continuously covers a display element and the partition, the display element including the lower electrode, the upper electrode and the organic layer; and
reducing a thickness of, of the sealing layer, a portion located above the lower electrode exposed from the rib through the pixel aperture.

10. The manufacturing method of claim 9, wherein
the reducing the thickness includes:
providing a resist on, of the sealing layer, a portion which covers the partition; and
reducing a thickness of, of the sealing layer, a portion exposed from the resist by etching.

11. The manufacturing method of claim 9, wherein after the reduction of the thickness, the sealing layer includes:

a first portion which is located above the rib and has a first thickness; and a second portion which is located above the lower electrode exposed from the rib through the pixel aperture and has a second thickness less than the first thickness.

12. The manufacturing method of claim 11, wherein the first portion surrounds the second portion as seen in plan view.

13. The manufacturing method of claim 11, wherein the second thickness is less than or equal to half the first thickness.

14. The manufacturing method of claim 11, wherein the first thickness is greater than a height of the partition, and the second thickness is less than the height of the partition.

15. The manufacturing method of claim 11, wherein the first thickness is greater than or equal to 1.0 μm, and the second thickness is less than 1.0 μm.

16. The manufacturing method of claim 15, wherein the second thickness is greater than or equal to 0.1 μm.

17. The manufacturing method of claim 11, wherein a distance between the partition and the second portion is greater than or equal to a height of the partition.

18. The manufacturing method of claim 11, wherein the partition comprises:

a lower portion provided on the rib; and an upper portion provided on the lower portion and protruding relative to a side surface of the lower portion, the upper electrode is in contact with the side surface, and the first portion covers part of the side surface.

* * * * *